(12) United States Patent
Cai et al.

(10) Patent No.: US 8,329,564 B2
(45) Date of Patent: Dec. 11, 2012

(54) METHOD FOR FABRICATING SUPER-STEEP RETROGRADE WELL MOSFET ON SOI OR BULK SILICON SUBSTRATE, AND DEVICE FABRICATED IN ACCORDANCE WITH THE METHOD

(75) Inventors: Jin Cai, Corlandt Manor, NY (US); Amlan Majumdar, White Plains, NY (US); Tak H. Ning, Yorktown Heights, NY (US); Zhibin Ren, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 425 days.

(21) Appl. No.: 11/925,069

(22) Filed: Oct. 26, 2007

(65) Prior Publication Data
US 2009/0108350 A1 Apr. 30, 2009

(51) Int. Cl.
*H01L 21/20* (2006.01)
(52) U.S. Cl. ........ 438/478; 438/297; 438/225; 257/351; 257/510; 257/647; 257/E21.415
(58) Field of Classification Search .......... 257/408, 257/348, E21.433, 351, 510, 647, E21.415; 438/199, 289, 184, 478, 297, 225
See application file for complete search history.

(56) References Cited

U.S. PATENT DOCUMENTS
4,633,289 A 12/1986 Yuan-Tai Chen ............... 357/42
4,900,692 A * 2/1990 Robinson ..................... 438/421

(Continued)

FOREIGN PATENT DOCUMENTS
WO WO 2006/034189 A2 3/2006

OTHER PUBLICATIONS

Jung-Ho Lee et al., "Effect of laser annealing on delta-doped boron for super-steep-retrograded well formation using selective Si epitaxy", Journal of Vacuum Science & Technology B: Microelectronics Processing and Phenomena, American Vacuum Society, New York, NY, vol. 21, No. 3, May 2003-Jun. 2003 pp. 936-941, XP012009899.

(Continued)

*Primary Examiner* — Evan Pert
*Assistant Examiner* — Mark A Laurenzi
(74) *Attorney, Agent, or Firm* — Harrington & Smith; Louis J. Percello

(57) ABSTRACT

A method is provided to fabricate a semiconductor device, where the method includes providing a substrate comprised of crystalline silicon; implanting a ground plane in the crystalline silicon so as to be adjacent to a surface of the substrate, the ground plane being implanted to exhibit a desired super-steep retrograde well (SSRW) implant doping profile; annealing implant damage using a substantially diffusionless thermal annealing to maintain the desired super-steep retrograde well implant doping profile in the crystalline silicon and, prior to performing a shallow trench isolation process, depositing a silicon cap layer over the surface of the substrate. The substrate may be a bulk Si substrate or a Si-on-insulator substrate. The method accommodates the use of an oxynitride gate stack structure or a high dielectric constant oxide/metal (high-K/metal) gate stack structure. The various thermal processes used during fabrication are selected/controlled so as to maintain the desired super-steep retrograde well implant doping profile in the crystalline silicon.

18 Claims, 17 Drawing Sheets

U.S. PATENT DOCUMENTS

| | | | | |
|---|---|---|---|---|
| 4,947,192 | A * | 8/1990 | Hawkins et al. | 347/59 |
| 5,726,488 | A | 3/1998 | Watanabe et al. | 257/655 |
| 5,923,987 | A | 7/1999 | Burr | 438/304 |
| 5,985,727 | A | 11/1999 | Burr | 438/302 |
| 6,323,073 | B1 | 11/2001 | Yeh et al. | 438/181 |
| 6,423,601 | B1 | 7/2002 | Ishida et al. | 438/306 |
| 6,706,614 | B1 * | 3/2004 | An et al. | 438/429 |
| 6,730,568 | B2 | 5/2004 | Sohn | 438/289 |
| 6,881,641 | B2 | 4/2005 | Wieczorek et al. | 438/358 |
| 6,881,987 | B2 | 4/2005 | Sohn | 257/192 |
| 6,927,137 | B2 | 8/2005 | Chakravarthi et al. | 438/289 |
| 6,949,768 | B1 | 9/2005 | Anderson et al. | 257/74 |
| 6,952,040 | B2 | 10/2005 | Chau et al. | 257/412 |
| 7,002,214 | B1 | 2/2006 | Boyd et al. | 257/351 |
| 7,061,058 | B2 | 6/2006 | Chakravarthi et al. | 257/404 |
| 7,071,044 | B1 | 7/2006 | Krishnan et al. | 438/197 |
| 7,078,722 | B2 * | 7/2006 | Anderson et al. | 257/19 |
| 7,199,430 | B2 | 4/2007 | Babcock et al. | 257/368 |
| 2002/0033511 | A1 | 3/2002 | Babcock et al. | 257/408 |
| 2004/0053457 | A1 | 3/2004 | Sohn | 438/197 |
| 2004/0266154 | A1 * | 12/2004 | Lim et al. | 438/592 |
| 2005/0250289 | A1 | 11/2005 | Babcock et al. | 438/309 |
| 2006/0022270 | A1 * | 2/2006 | Boyd et al. | 257/351 |
| 2006/0030094 | A1 | 2/2006 | Chui et al. | 437/197 |
| 2007/0128820 | A1 | 6/2007 | Majumdar et al. | 438/369 |

OTHER PUBLICATIONS

Z. Ren et al., "Selective Epitaxial Channel Ground Plane Thin SOI CMOS Devices", Electron Devices Meeting, IEDM Technical Digest, IEEE International, Dec. 5, 2005, pp. 733-736, XP010903588.

H. C. Tseng et al., "Effects of isolation materials on facet formation for silicon selective epitaxial growth", Applied Physics Letters, AIP, American Institute of Physics, Melville, NY, vol. 71, No. 16, Oct. 20, 1997, pp. 2328-2330, XP000725891.

"Selective Epitaxial Channel Ground Plane Thin SOI CMOS Devices", Zhibin Ren, et al., IEEE 2005, 4 pgs.

* cited by examiner

METHOD FOR FABRICATING SUPER-STEEP RETROGRADE WELL MOSFET ON SOI OR BULK SILICON SUBSTRATE, AND DEVICE FABRICATED IN ACCORDANCE WITH THE METHOD

TECHNICAL FIELD

The exemplary embodiments of this invention relate generally to complementary metal-oxide-semiconductor (CMOS) field-effect transistors (FETs), and more particularly, to a method for forming super-steep retrograde well (SSRW) FETs on a silicon-on-insulator (SOI) substrate or on a bulk Si substrate with an oxynitride/poly-Si or high-K/metal gate stack.

BACKGROUND

CMOS FETs are universally employed in electronic circuit applications, such as signal processing, computing, and wireless communications as non-limiting examples. Scaling down to smaller dimensions the gate length of both N-channel FETs (NFETs) and P-channel FETs (PFETs) in CMOS circuits leads to increased CMOS circuit speed. However, detrimental short-channel effects lead to high off-state leakage currents in CMOS devices, thereby increasing the power consumption. In a case of extreme short-channel effects, CMOS circuits fail to operate.

Halo doping is a commonly used technique in the industry to minimize short-channel effects (SCEs). FIGS. 1a and 1b show a cross-section of conventional halo-doped FETs on SOI wafers and bulk Si wafers, respectively. Halo doping, however, leads to the following well known problems:

1. Halo doping introduces ionized impurities in the channel region that lead to degradation of carrier mobility in the MOSFET inversion layer.
2. Statistical fluctuations in the number of halo dopant atoms, commonly referred to as random dopant fluctuations, increase as the halo doping density is increased and can result in large variations in threshold voltage. This problem is particularly troublesome for static random access memory (SRAM) transistors and could potentially lead to SRAM failure.
3. Halo doping causes partial compensation of the source/drain extension regions, thereby increasing the FET external series resistance.

The SSRW FET is a device geometry with an undoped channel and a heavily-doped laterally-uniform ground plane that is expected to exhibit better short-channel control, better carrier transport properties, lower threshold voltage variations, and lower parasitic series resistance than conventional halo-doped devices on either SOI or bulk Si substrate. For the SSRW FET, the presence of a heavily-doped ground plane leads to significantly improved SCEs as compared to conventional halo-doped devices. In the SSRW FET, there is no need for halo doping as the ground plane fulfills the function of controlling SCEs and avoids the above-identified halo doping problems.

Prior art methods of fabricating SSRW FETs suffer from various problems, and the resultant transistors do not demonstrate the expected benefits of SSRW FETs. The following properties of the SSRW structure are now well established.

1. SSRW FETs with a proper choice of undoped channel thickness and ground-plane doping exhibit superior short channel effects as compared to conventional halo-doped devices on either SOI or bulk Si substrates.
2. SSRW FETs should not suffer from degradation of carrier mobility in the MOSFET inversion layer since the channel region is undoped or very lightly doped ($\leqq 10^{16}$ cm$^{-3}$ surface doping concentration) and, therefore, the channel is substantially free of ionized impurities.
3. SSRW FETs should not suffer from large variations in threshold voltage due to random dopant fluctuations because the channel region is undoped, and the heavily-doped ground plane is away from the surface region.
4. SSRW FETs should not suffer from an increase in FET external series resistance because there are no halo implants to compensate the source/drain extension regions.

Additionally, some other desirable properties for MOSFETs are mentioned below.

5. CMOS devices should have low junction leakage current in order to reduce net transistor off-state current, thereby reducing CMOS circuit power consumption.
6. CMOS devices should have low deep source/drain-to-well junction capacitance in order to reduce parasitic capacitance, thereby increasing CMOS circuit speed.

U.S. Pat. No. 6,423,601 B1 (Ishida et al.) teaches the use of nitrogen and boron co-implants for forming p-type well region for NFETs with a parabolically-shaped dopant concentration profile. While a parabolically-shaped dopant profile will provide the benefit of a punch-through stopper for CMOS on bulk Si substrates, it is not sharp enough to reduce short-channel channel effects in CMOS transistors with gate lengths below 30 nm, and therefore, does not satisfy property (1) mentioned above.

U.S. Pat. No. 7,199,430 B2 (Babcock et al.) teaches the use of laterally-uniform carbon containing layers or carbon halo co-implants to prevent diffusion of well implants into the channel region. As is stated in the claims, the carbon-containing layers must contain at least 0.1 atomic percent of carbon, that is, the carbon concentration must be greater than $5 \times 10^{19}$ cm$^{-3}$. It is well known that a high dose of impurity concentration near the deep source/drain region leads to large junction leakage current, thereby increasing the net off-state leakage current of CMOS devices and thus fails to satisfy property (5) mentioned above.

U.S. Patent Application 2007/0128820 A1 (Majumdar et al) describes a method for forming a self-aligned retrograde well using a removable gate process flow in order to reduce junction capacitance and junction leakage current. This method involves high-energy ion implantation for creating a retrograde well. It is well known that high-energy implants have large vertical straggle, and therefore, will not lead to a super-steep retrograde well implant profile. This method, therefore, fails to satisfy property (1) mentioned above. Furthermore, a removable gate process for gate lengths below 30 nm could also lead to low device and circuit yield due to problems with gap fill for gap sizes below 30 nm.

U.S. Pat. No. 6,881,987 B2 (Sohn) describes a retrograde well PFET structure on bulk Si wafers and provides a method for making same that leads to surface doping concentration $C_S \sim 1 \times 10^{17}$ cm$^{-3}$, as shown herein in FIG. 1c (which reproduces FIG. 5 of the patent).

U.S. Pat. Nos. 6,927,137 B2 (Chakravarthi et al.) and 7,061,058 B2 (Chakravarthi et al.) describe a method for fabricating retrograde well NFETs. The method involves conventional boron p-well formation and the use of hydrogen implants in the gate dielectric layer to attract boron near the surface into the gate dielectric layer during a subsequent source/drain activation anneal. This method leads to surface doping concentration $C_S \sim 1 \times 10^{18}$ cm$^{-3}$, as shown herein in FIG. 1d, which reproduces FIG. 2 of the patent).

A surface doping concentration $C_S \sim 10^{17}\text{-}10^{18}$ cm$^{-3}$ achieved using the methods in U.S. Pat. Nos. 6,881,987 B2 (Sohn), 6,927,137 B2 (Chakravarthi et al.), and 7,061,058 B2 (Chakravarthi et al.) is lower than that achieved in conventional halo-doped devices, but not sufficiently low to realize a substantial mobility benefit because at least significant ionized impurity scattering. These methods, therefore, fail to satisfy property (2) mentioned above.

U.S. Pat. No. 6,881,641 B2 (Wieczorek et al.) describes a retrograde well FET structure on a bulk Si wafer where "an epitaxially grown channel layer is provided on a well structure after ion implantation steps and heat treatment steps are performed to establish a required dopant profile in the well structure". This patent describes the formation of the well region after STI formation: "After formation of the shallow trench isolation 302, the P-well structure 310 and the N-well structure 320 are defined by ion implantation". This implies that the channel region is epitaxially grown after STI formation.

U.S. Pat. No. 7,002,214 B1 (Boyd et al.) describes a retrograde well FET structure on ultra-thin SOI substrates, where an undoped, epitaxial Si cap is formed after retrograde well ion implantation and STI formation. The process flow, shown herein in FIG. 1e, which reproduces FIG. 4 of the patent, is not suitable for maintaining the steepness of retrograde well implant profiles seen in FIG. 1f, which reproduces FIG. 6 found in: Z. Ren, M. Ieong, J. Cai, J. Holt, D. Boyd, R. Mo, H. Yin, O. Dokumaci, S. Kawanaka, T. Sato, P. Ronsheim, J. Wang, C. Y. Sung, and W. Haensch, "Selective epitaxial channel ground plane thin SOI CMOS devices", IEDM Technical Digest, December 2005.

Both U.S. Pat. Nos. 6,881,641 B2 (Wieczorek et al.) and 7,002,214 B1 (Boyd et al.) provide a method for fabricating retrograde well FETs where the Si cap epitaxy is performed after STI formation. However, performing Si cap epitaxy after STI formation leads to Si cap thickness non-uniformity, which in turn acts as another source of variation and can result in large variations in transistor threshold voltage. These methods, therefore, fail to satisfy property (3) mentioned above. Furthermore, Si epitaxy on narrow width devices, such as those used in SRAMs, leads to faceted growth due to differential growth rates on different crystallographic orientations, as shown schematically in FIG. 1g. This leads to high electric fields underneath the gate electrode near the STI edge and a large leakage current, thereby increasing the net off-state leakage current of CMOS devices.

None of the foregoing US patents and the publication describe a retrograde well FET structure and method for forming the same that satisfies all the generally established advantages of the SSRW structure (properties 1-4 mentioned above) and that also satisfies basic desired properties of CMOS transistors in CMOS circuits (properties 5 and 6 mentioned above). It would thus be highly desirable to provide a method of making SSRW CMOS devices that satisfy all the above mentioned desirable properties of SSRW FETs and CMOS FETs (properties 1-6 mentioned above).

SUMMARY

The foregoing and other problems are overcome, and other advantages are realized, in accordance with the exemplary embodiments of this invention.

In accordance with an aspect of this invention a method is provided to fabricate a semiconductor device, where the method includes providing a substrate comprised of crystalline silicon; implanting a ground plane in the crystalline silicon so as to be adjacent to a surface of the substrate, the ground plane being implanted to exhibit a desired super-steep retrograde well implant doping profile; annealing implant damage using a substantially diffusionless thermal annealing to maintain the desired super-steep retrograde well implant doping profile in the crystalline silicon and, prior to performing a shallow trench isolation process, depositing a silicon cap layer over the surface of the substrate.

In the exemplary and non-limiting embodiments of this invention the substrate may be a bulk Si substrate or a Si-on-insulator substrate, the method accommodates the use of an oxynitride gate stack structure or a high dielectric constant oxide/metal (high-K/metal) gate stack structure, and the various thermal processes used during fabrication are selected/controlled so as to maintain the desired super-steep retrograde well implant doping profile in the crystalline silicon.

In accordance with a further aspect of this invention a semiconductor structure comprises a substrate comprised of crystalline silicon; a ground plane in the crystalline silicon adjacent to a surface of the substrate, the ground plane exhibiting a super-steep retrograde well doping profile; a silicon cap layer over the surface of the substrate, said silicon cap layer being substantially free of faceting; and a trench isolation region that surrounds an active device area and that is formed through the silicon cap layer and into the underlying crystalline silicon substrate.

Preferably the silicon cap layer is formed with a silicon epitaxy process at a temperature at or below about 700° C. to maintain the desired super-steep retrograde well doping profile, and the silicon epitaxy process is performed prior to formation of the trench isolation region so that the trench isolation region can be formed through the silicon cap layer.

In accordance with a still further aspect of this invention a complementary metal-oxide-semiconductor super-steep retrograde well field-effect transistor is comprised of one of a silicon-on-insulator substrate or a bulk silicon substrate and a ground plane disposed in crystalline silicon adjacent to a surface of the substrate, where the ground plane having a doping profile that forms the super-steep retrograde well. The field-effect transistor further includes a silicon cap layer over a surface of the substrate, where the silicon cap layer is substantially free of faceting, and a trench isolation region that surrounds an active device area and that is formed through the silicon cap layer and into the underlying crystalline silicon of the substrate. The field-effect transistor further includes one of a gate oxide or a high-K/metal gate structure disposed over the silicon cap layer within the active device area, and a layer of polycrystalline silicon disposed over the gate structure, where the polycrystalline silicon layer is doped with a dopant species appropriate for forming one of an N-type or a P-type field-effect transistor.

BRIEF DESCRIPTION OF THE DRAWINGS

The foregoing and other aspects of the embodiments of this invention are made more evident in the following Detailed Description, when read in conjunction with the attached Drawing Figures, wherein.

DETAILED DESCRIPTION

The exemplary embodiments of this invention provide methods for fabricating SSRW FET structures on SOI or bulk Si substrates with, for example, poly-Si/oxynitride or a high-K/metal gate stack, where the resultant FET structure exhibits super-steep retrograde wells.

Figure 1A:
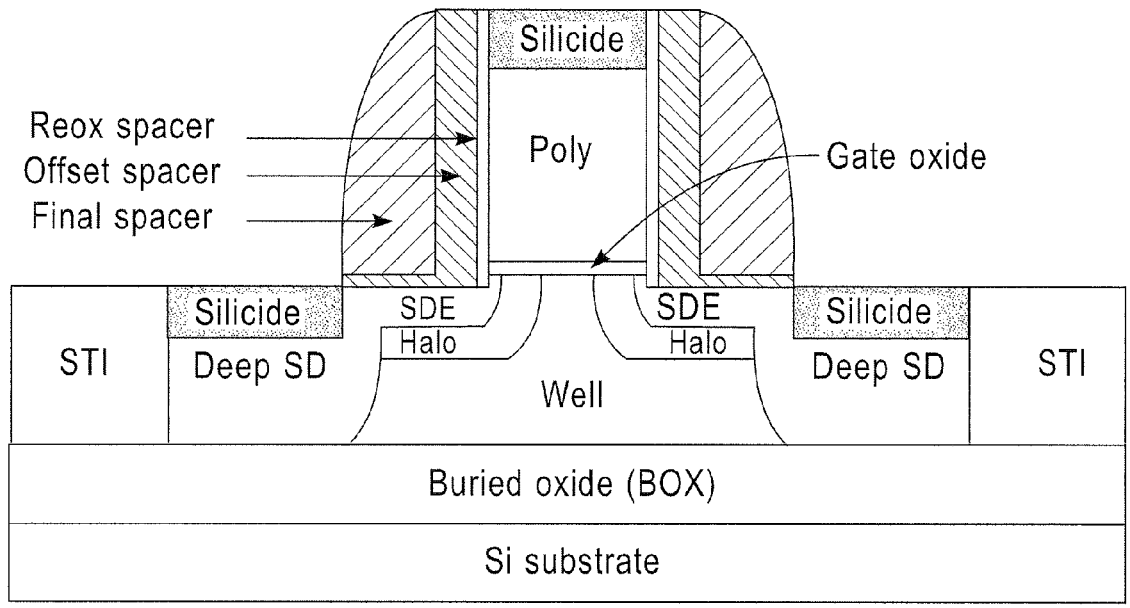
FIGS. 1a through 1g illustrate various prior art approaches, as detailed above.
Figure 1B:
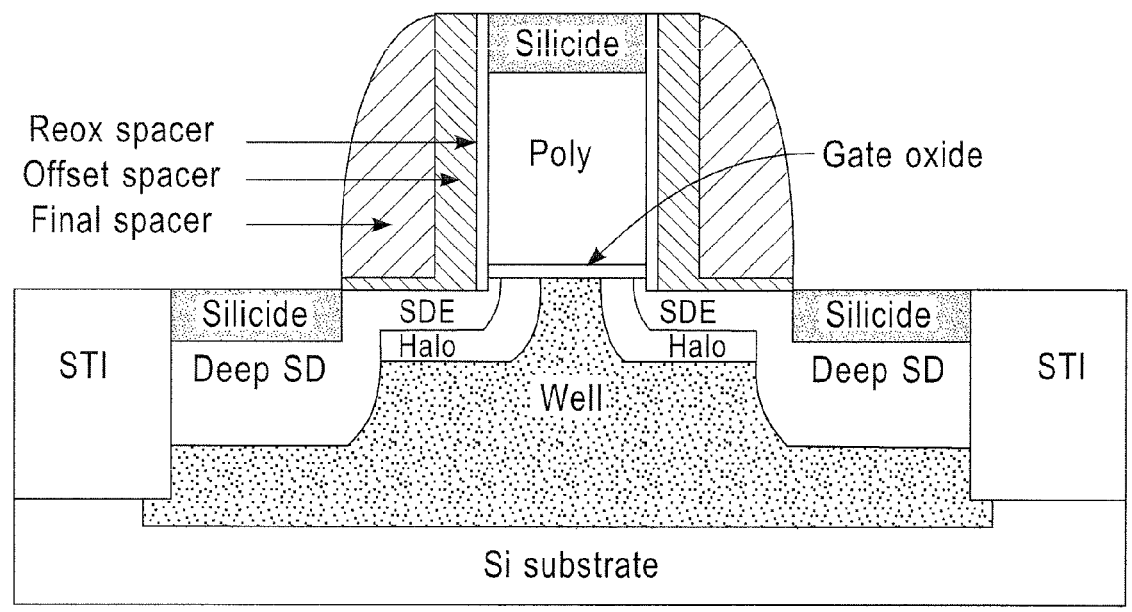
Figure 1C:
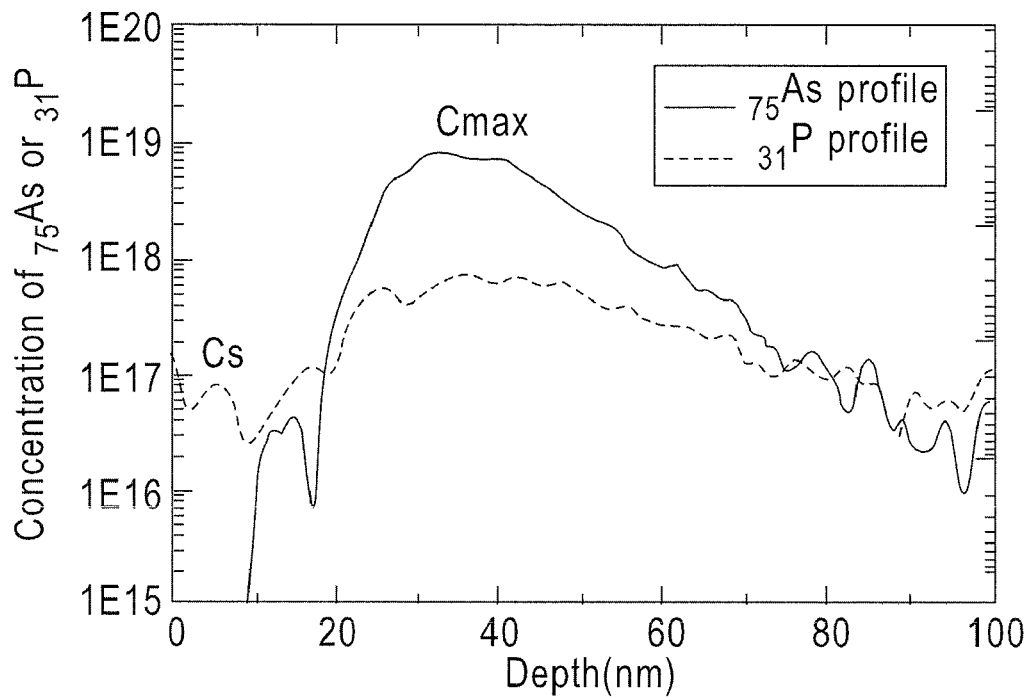
Figure 1D:
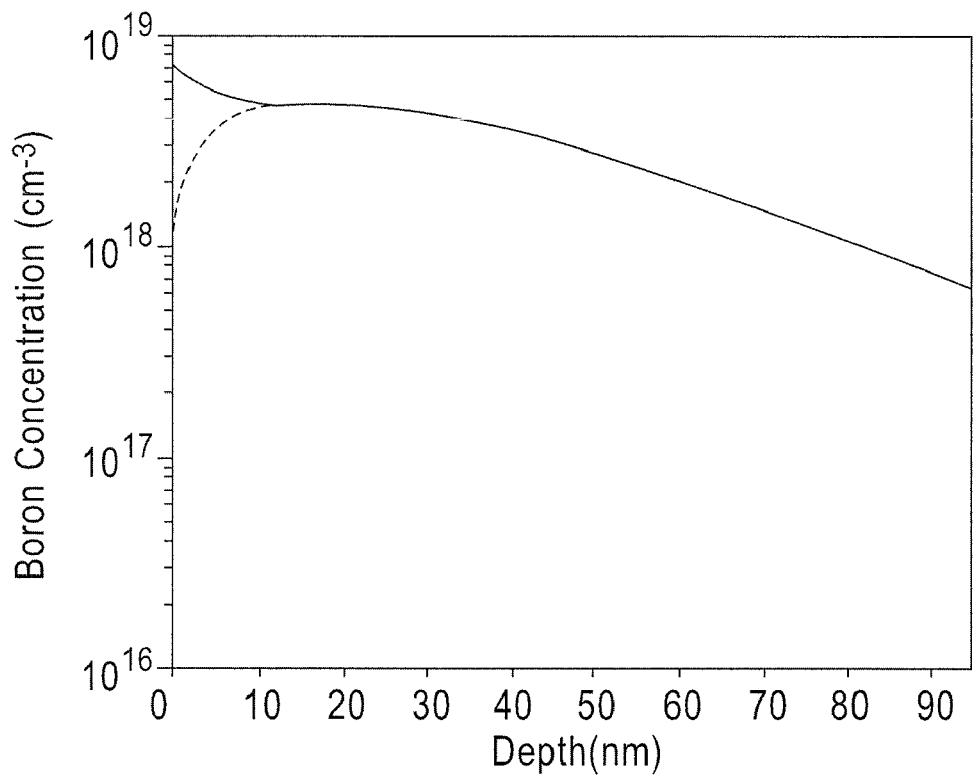
Figure 1E:
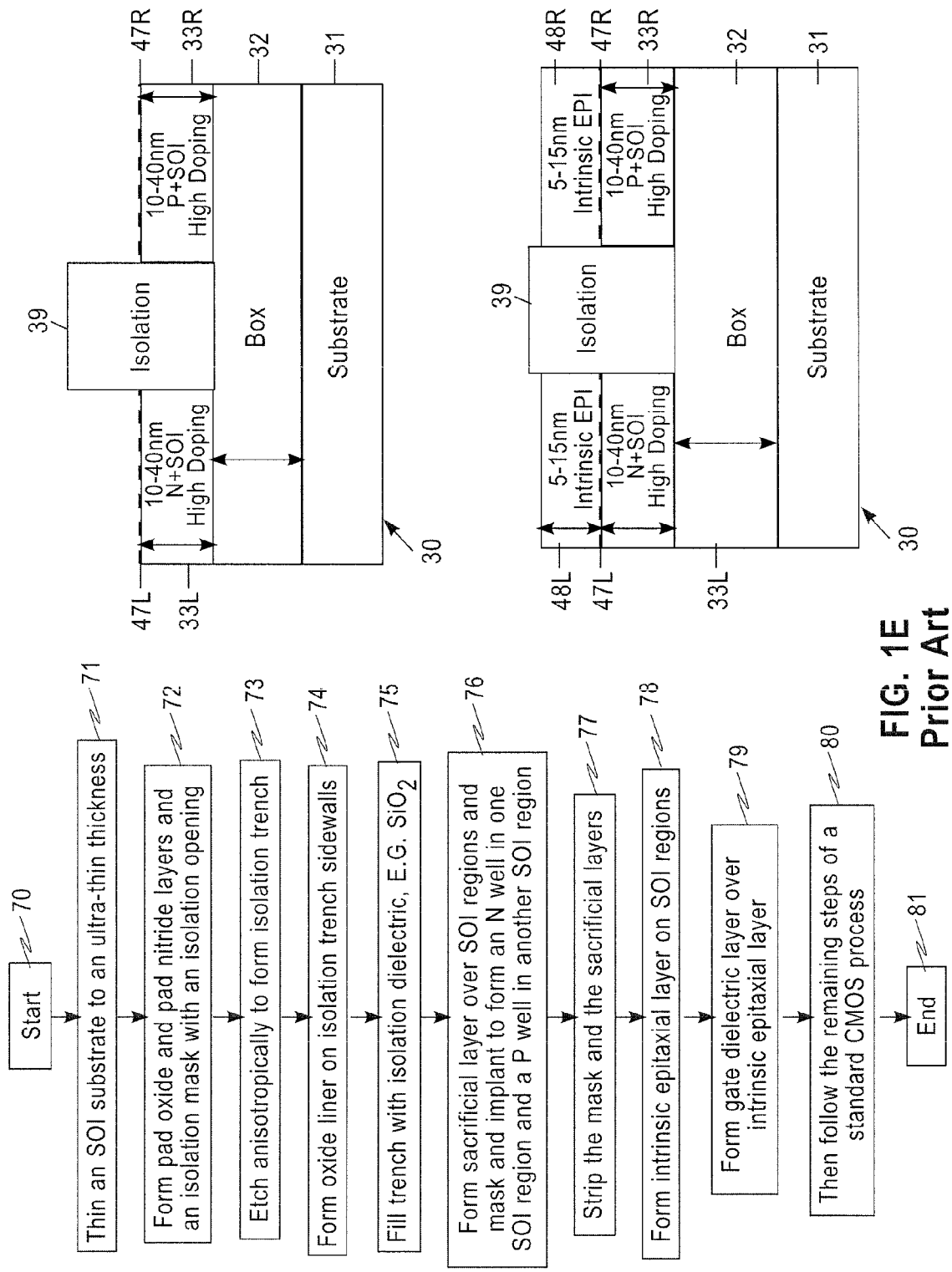
Figure 1F:
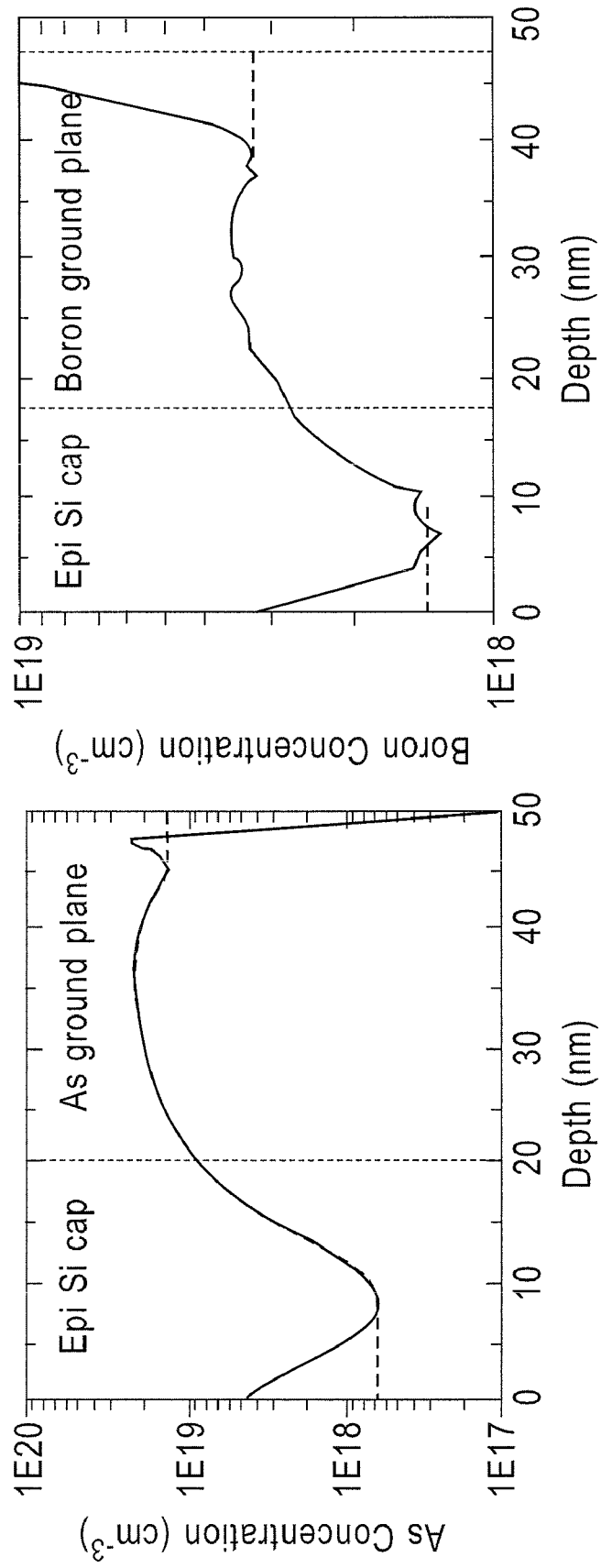
Figure 1G:
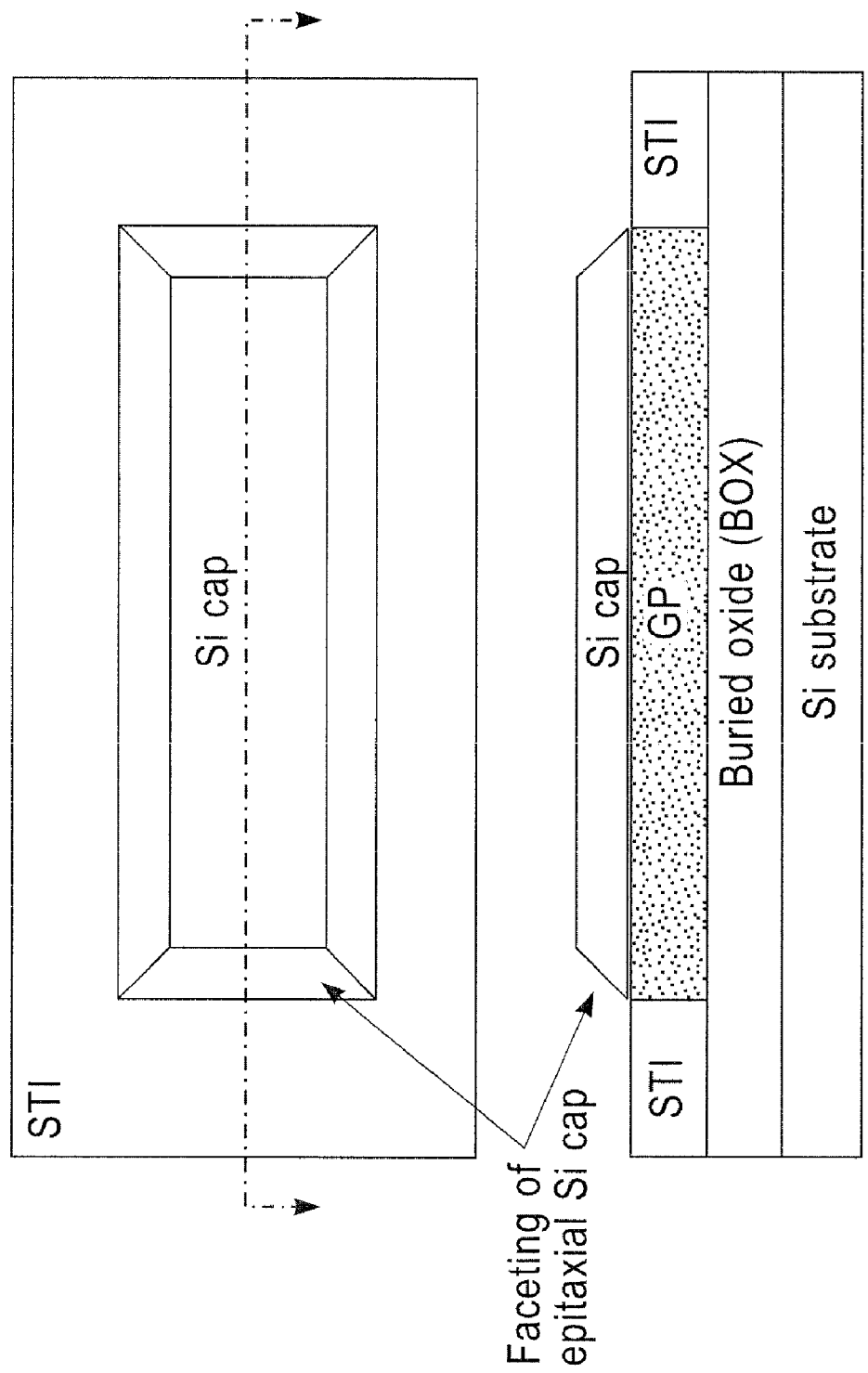
Figure 2:
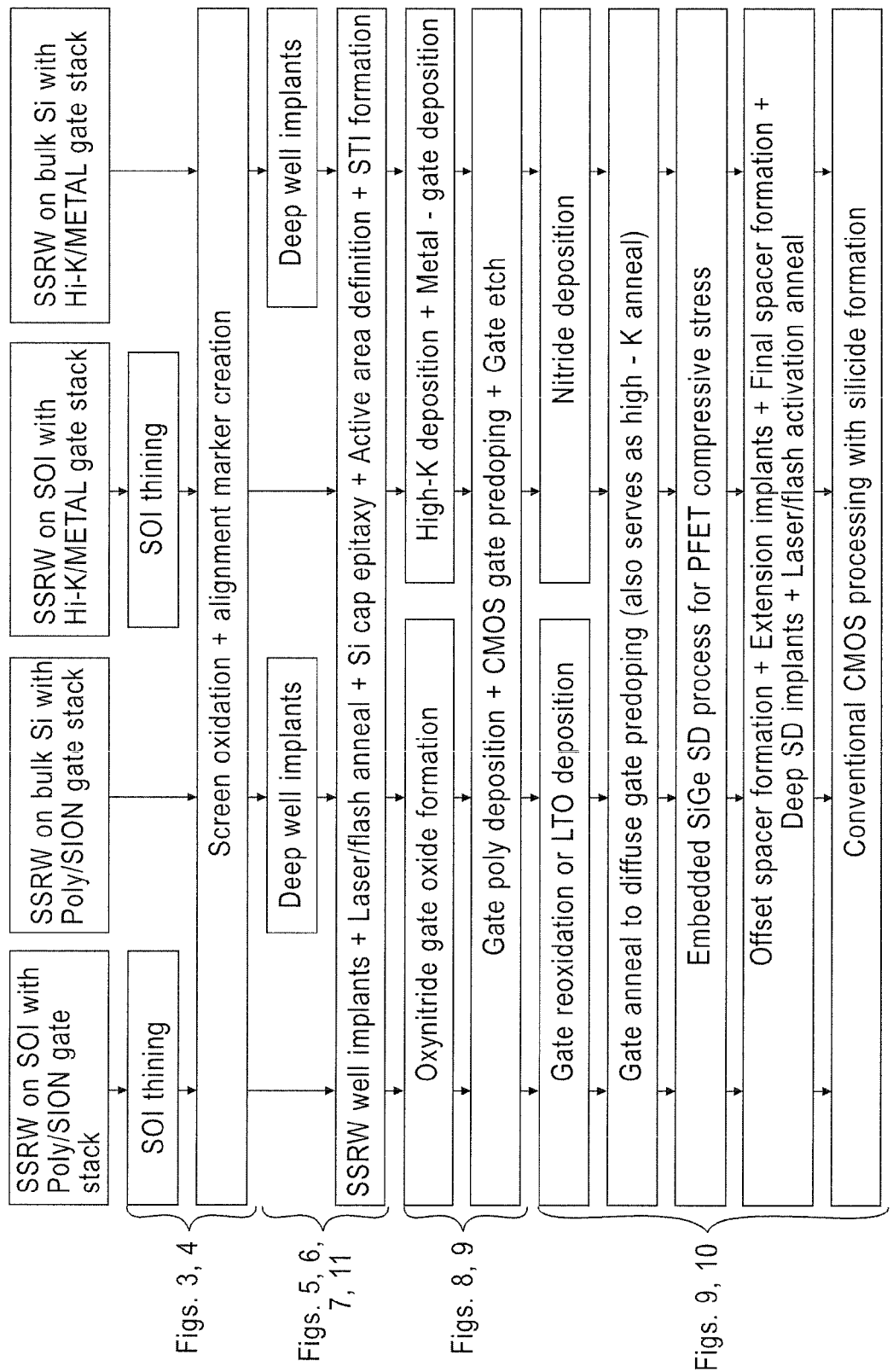
FIG. 2 is an overall process flow diagram for the various embodiments of this invention shown in the cross-sectional, enlarged views of semiconductor wafers shown FIGS. 3 and 5 through 11, and in the schematic, top view representation shown in FIG. 4.

The ensuing description of the exemplary embodiments of this invention depicted in FIGS. 3 through 11 is intended as well to be read in view of the overall process flows shown in FIG. 2.

Figure 3A:
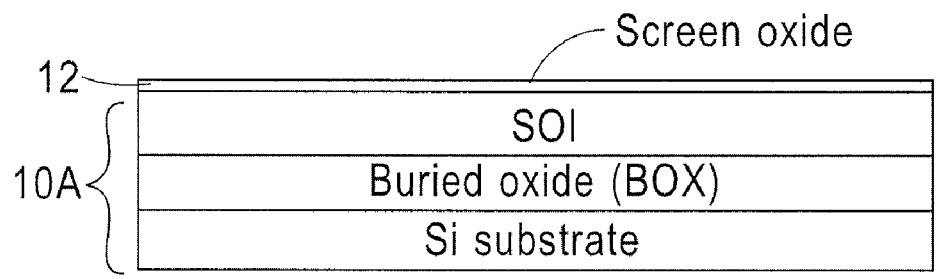
Figure 3B:
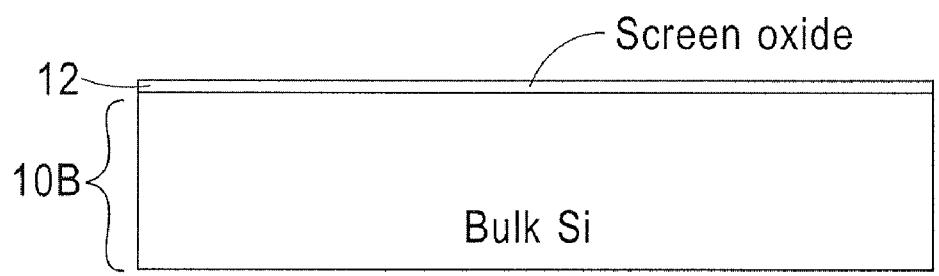

Referring to FIGS. 3a and 3b, the starting substrate may be a SOI wafer 10A (FIG. 3a) or a bulk Si wafer 10B (FIG. 3b). The SOI wafer 10A may be a thick SOI wafer with SOI thickness in the 30-90 nm range, or it may be a thin SOI wafer with SOI thickness in the 15-30 nm range. For the case of a thick SOI starting wafer 10A, SOI thinning may be performed to reduce the SOI thickness down to the 15-30 nm range using, as an example, an oxidation and hydrofluoric acid (HF) wet etch, as is well known. In other words, the initial choice of wafer type (SOI or bulk) is not a limitation upon the practice of this invention.

In either case the wafer 10 is oxidized to create a nominally 2-10 nm oxide screening layer 12. This oxide layer 12 is used for alignment marker definition and as an implant screening layer, as described below. FIGS. 3a and 3b show the cross-section of the SOI wafer 10A and the bulk Si wafer 10B, respectively, after this step.

Figure 4:
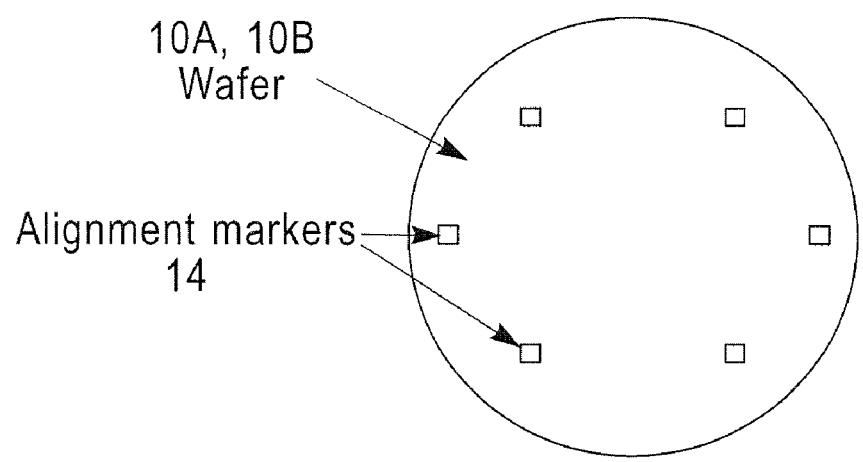

As shown in FIG. 4, photolithography and reactive-ion etch (RIE) are then used to create alignment markers 14 on top surfaces of the blanket wafers 10A, 10B. The alignment markers are used for subsequent photolithography steps that are used for creating SSRW wells for NFETs and PFETs. The top view schematic representation of the wafer 10A, 10B after alignment creation is shown in FIG. 4.

CMOS SSRW well implants are then performed done using photolithography, ion implantation and photoresist (PR) stripping processes. Photolithography is used for selectively defining NFET or PFET areas for well implants. NFET well ion implantation involves a p-type implant species such as B, $BF_2$, or In, while PFET well ion implantation involves an n-type implant species such as As, P, or Sb. The typical dosage for all SSRW well implants is in the range from $10^{13}$ to $10^{14}$ cm$^{-2}$. The typical range of implant energies are about 0.2 to 1 keV for B, 1 to 5 keV for $BF_2$, 5-30 keV for In, and 5-25 keV for As, P, and Sb. It can be noted that for the case of the bulk Si wafer 10B additional higher energy well implants are also used to provide well isolation. For well isolation implants, typical dosage is in the $10^{12}$ to $10^{13}$ cm$^{-2}$ range. The typical implant energy ranges are about 100-300 keV for As, P, and $BF_2$ and 20-60 keV for B.

Figure 5A:
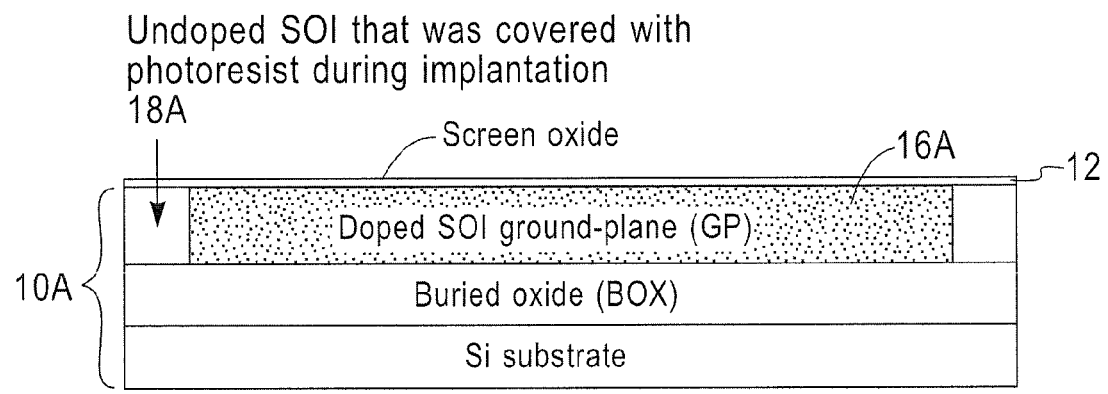
Figure 5B:
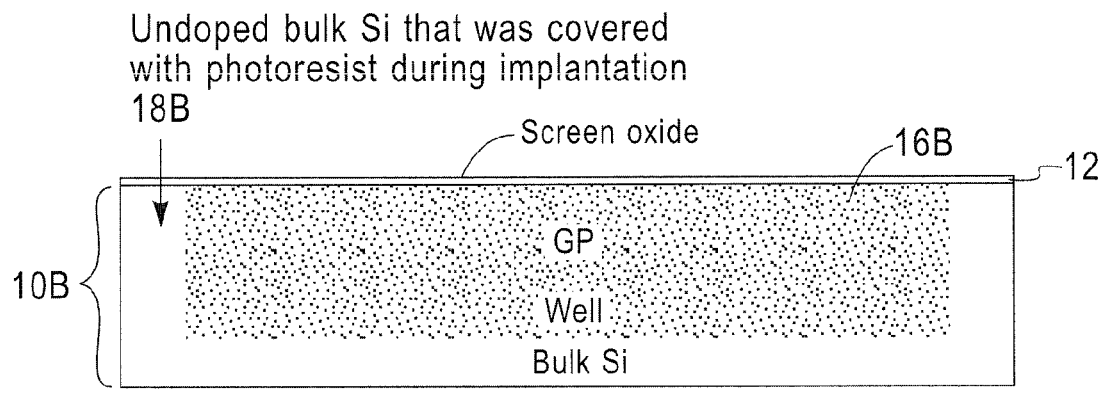

Ion implantation causes damage to Si that is cured using a thermal anneal. Conventional CMOS processing involves the use of rapid thermal annealing (RTA), with RTA temperatures typically higher than 900° C. and RTA times typically greater than 1 second. However, this type of thermal budget has been found to cause significant diffusion of the well implants leading to a broad and shallow well implant profile, and not the desired super-steep retrograde well profile. Therefore, the exemplary embodiments of this invention instead employ a substantially diffusionless thermal annealing technique, such as a millisecond laser anneal or a flash anneal, to cure the implant damage while maintaining the steepness of the SSRW well implant profiles. Suitable laser anneal or flash anneal temperatures are in the ~1100° C. to 1350° C. range, with an anneal time less than ~10 millisecond. FIGS. 5a and 5b show cross-sections of the SOI wafer 10A and the bulk Si wafer 10B, respectively, after this step, and illustrate the presence of a doped SOI ground plane (GP) 16A and a GP well 16B, respectively. Note also the regions of undoped SOI 18A and bulk Si 18B in wafers 10A and 10B, respectively, that results from a photoresist (PR) mask used during the implantation step.

Figure 6A:
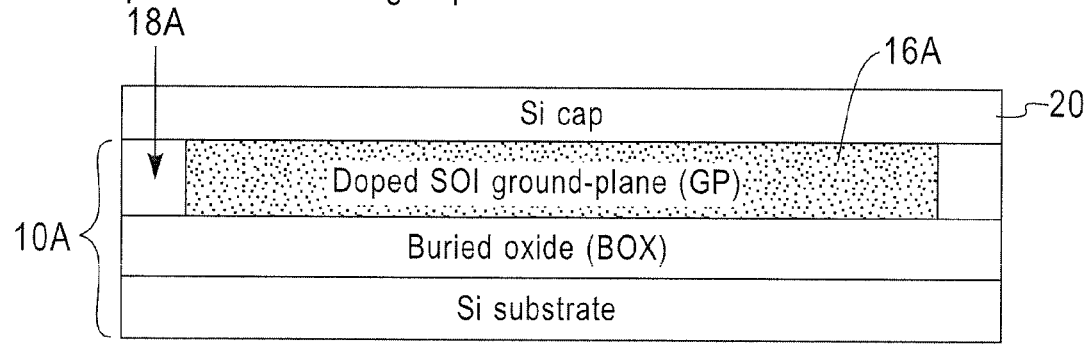
Figure 6B:
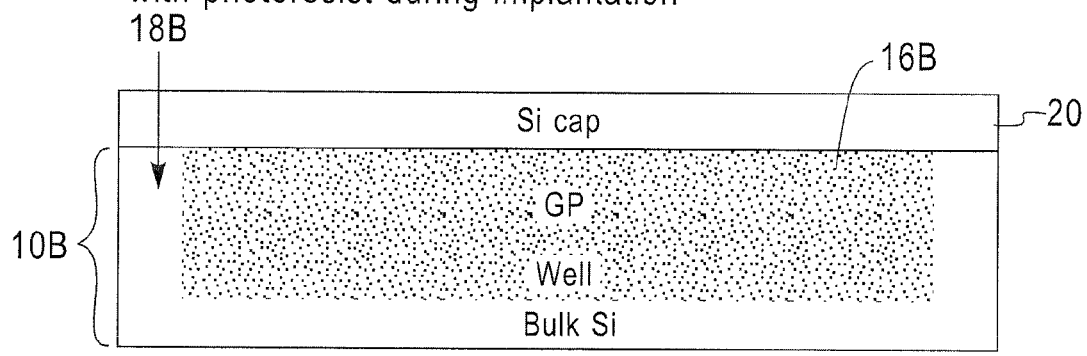

Referring now to FIGS. 6a and 6b, an undoped Si cap 20 is then deposited on the doped wafers 10A, 10B, respectively, to create an undoped (not intentionally doped) channel region. The Si epitaxy performed to deposit the Si cap 20 is preferably done at low temperatures, such as at or below about 700° C., to avoid the movement (diffusion) of the SSRW well implants during epitaxy. The screen oxide layer 12 is removed prior to the Si cap epitaxy, such as by using hydrofluoric acid.

In accordance with an aspect of the exemplary embodiments of this invention performing the Si cap 20 epitaxy on the blanket wafers 10A, 10B before shallow-trench isolation (STI) formation leads to a very uniform thickness of the Si cap 20, and also avoids the faceting of the Si cap 20 for narrow active area devices (such as, static RAM (SRAM) transistors), a problem that can occur if the Si cap 20 epitaxy is performed after STI formation.

As a non-limiting example, the cap thickness in a processed device (i.e., at the end of the line) is typically about 5-10 nm for short gate length devices. Based on this, the cap deposition target is about 12-17 nm because one can expect to typically lose about 7 nm of the Si cap during various ones of the processes (e.g., during pad oxidation, thick gate oxidation and thin gate oxidation).

Active area definition is then performed using padfilms deposition, photolithography, and reactive-ion etch (RIE). Reference in this regard can be made to FIGS. 11A and 11B which show just the SOI wafer 10A embodiment, it being realized that the processing for the bulk Si wafer 10B embodiment is substantially the same. The padfilms are preferably a pad oxide layer 21A (e.g., 2-10 nm) and a pad nitride layer 21B (e.g., 30-150 nm). Both the pad oxide and pad nitride processes are controlled to exhibit a low thermal budget to maintain the steepness of the SSRW well implant profiles. The pad oxide layer 21A may be formed using, as examples, plasma-assisted oxidation or low-temperature oxide deposition. The pad nitride layer 21B may be formed using, as examples, rapid-thermal chemical vapor deposition (RTCVD) or plasma-enhanced chemical vapor deposition (PECVD). Photolithography is then performed to define the active area with photoresist. A nitride/oxide/Si RIE followed by photoresist strip is then performed to create the active area.

Figure 7A:
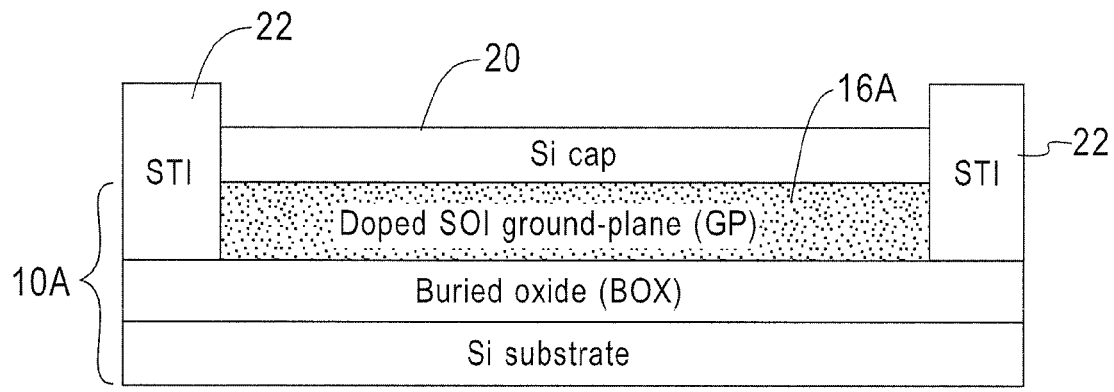
Figure 7B:
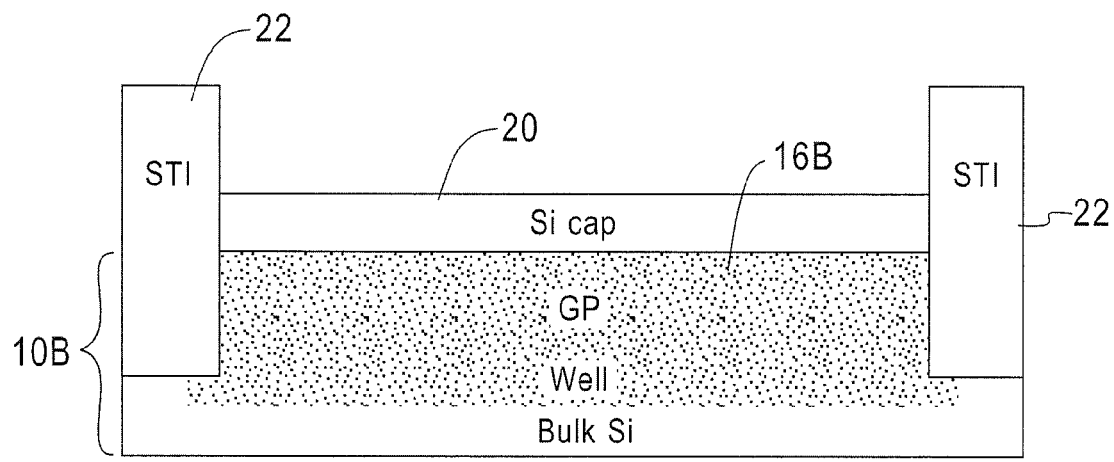

A shallow trench isolation (STI) process is then performed to create device isolation. The STI process includes STI oxide deposition and STI oxide CMP (chemical mechanical polishing) that stops on the underlying pad nitride layer 21B forming STI regions 22. Any remaining STI oxide on the pad nitride (due to incomplete removal of oxide during the STI CMP process) and pad nitride 21B are then removed using, for example, HF and a hot phosphoric acid wet etch, respectively. Finally, the pad oxide layer 21A is removed using HF, yielding the structure shown in FIG. 7a. FIGS. 7a and 7b show the wafer cross-section of the SOI 10A and bulk Si wafer 10B, respectively, after the STI 22 formation process.

In that most microelectronic chips have input/output (I/O) devices that operate at higher voltages than other circuitry (e.g., high speed circuitry) on the chip, it is desirable to provide a thick gate oxide for the I/O devices. Therefore, it is preferred that thick gate oxidation is performed first on the entire wafer 10A, 10B. This thick gate oxidation process is controlled to exhibit a low thermal budget to maintain the steepness of the SSRW well implant profiles.

High-speed devices in microelectronic chips typically have thin gate oxides. Therefore, the thick-oxide devices are masked off using photolithography and the thick oxide is removed from thin-oxide device areas using HF, which is followed by PR strip. The thin gate oxidation process is then performed. One may use, as examples, silicon dioxide ($SiO_2$), silicon oxynitride (SiON), or high-K (high dielectric constant) oxide as the thin gate oxide. $SiO_2$ or SiON can be formed using conventional rapid thermal oxidation tools, while a high-K oxide can be deposited using a metal-organic chemical vapor deposition (MOCVD) or an atomic-layer deposition (ALD) tool. The selected method of creating the thin gate oxide is controlled to have a low thermal budget to maintain the steepness of the SSRW well implant profiles.

Figure 8A:
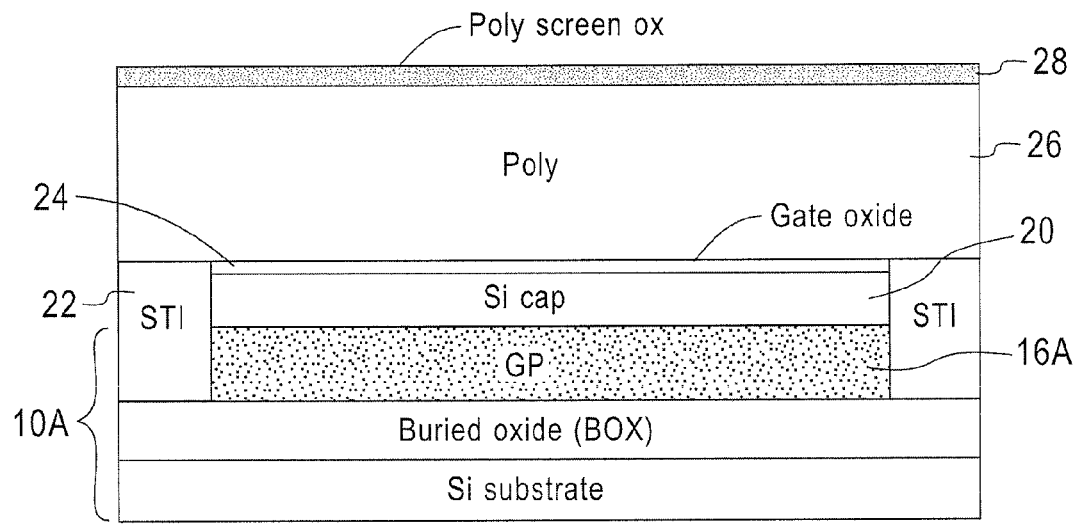
Figure 8B:
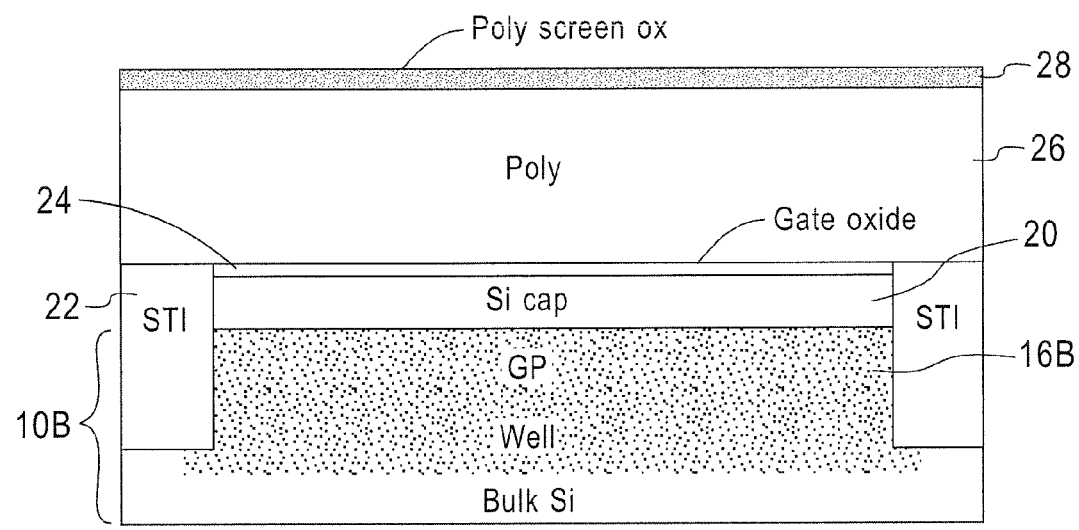
Figure 8C:
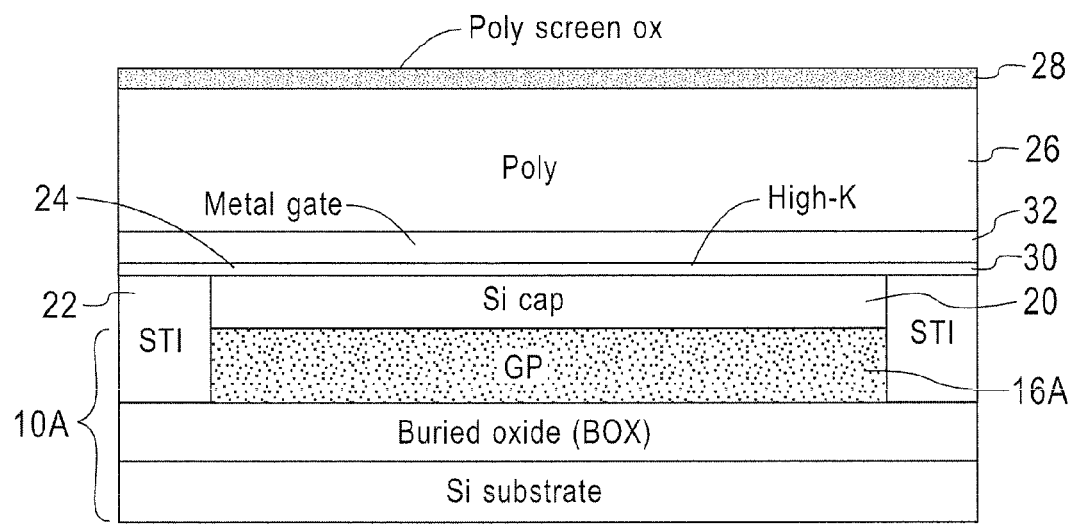
Figure 8D:
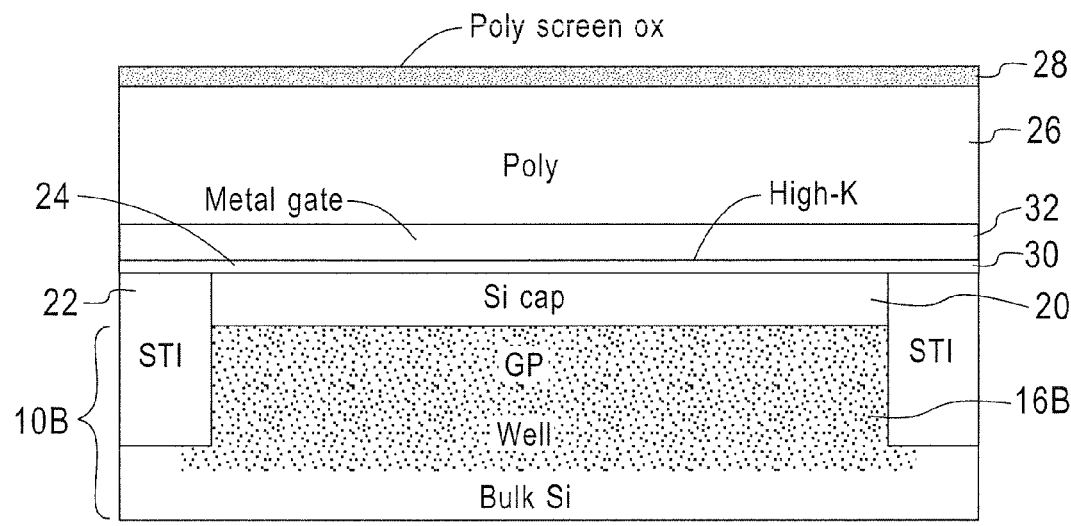

The resulting gate oxide layer 24 is shown in FIGS. 8a and 8b, while FIGS. 8c and 8d show the resulting hi-K oxide/metal gate structure 30, 32 is shown in FIGS. 8c and 8d.

More specifically, FET gate poly deposition or metal gate deposition followed by poly cap deposition is then performed to form the poly/oxynitride gate 24 (FIGS. 8a, 8b) or the high-K/metal-gate stack 30, 32 (FIGS. 8c and 8d). Non-limiting examples of a high-K oxide 30 are $HfO_2$, $ZrO_2$, and $Ti_2O_5$, and non-limiting examples of the associated metal gate 32 are TiN and TaN. The metal gate layer 32 can be deposited using a physical vapor deposition (PVD) tool, or MOCVD or ALD tools. The gate poly layer 26 Si can be deposited in a low-pressure chemical vapor deposition (LPCVD) tool or in a sputtered-Si tool. The resultant layer 26 of gate poly Si is then capped with a screening oxide layer 28 (poly screen oxide). The poly screen oxide layer 28 is created to provide a screen for gate implants. The poly screen oxide layer 28 can be deposited in a PECVD or RTCVD tool.

FIGS. 8a, 8b, 8c and 8d show cross-sections of the SOI wafer 10A with poly/oxynitride gate stack structure 24, the bulk Si wafer 10B with the poly/oxynitride gate stack structure 24, the SOI wafer 10A with the high-K/metal gate stack structure 30, 32, and the bulk Si wafer 10B with the high-K/metal gate stack structure 30, 32, respectively, after this step.

The gate poly 26 is then doped to create gate lines with low resistance. Low gate line resistance is desired for achieving the high-speed switching of FETs. The selective doping of NFETs with n-type gate implants and PFETs with p-type gate implants is achieved using photolithography. NFET gate implantation involves the use of a p-type species such as As, P, or Sb, while PFET gate implantation involves the use of an n-type species such as B, $BF_2$, or In.

Transistor gates 26A are then defined using photolithography, gate RIE, PR strip, and wet cleans to remove polymers formed during the gate RIE step. The wet cleans step may employ a HF wet etch that removes the poly screen oxide layer 28.

Figure 9A:
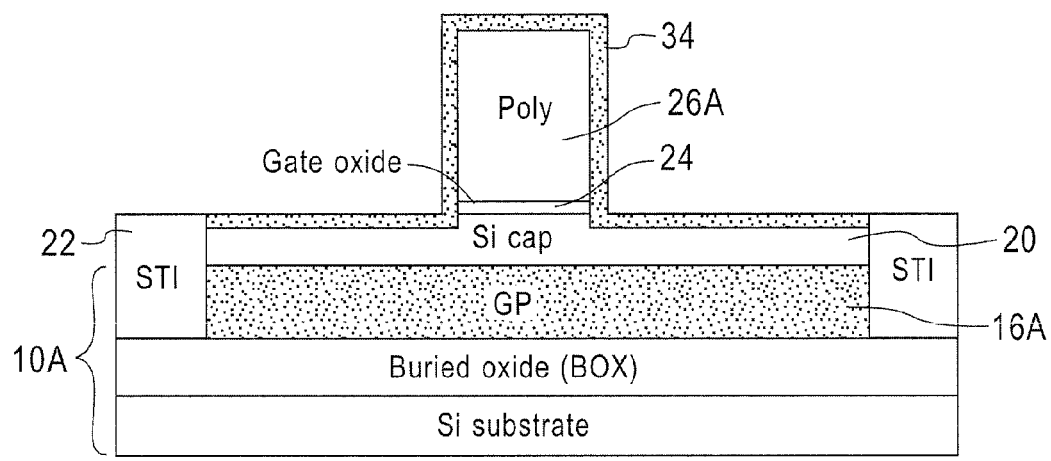
Figure 9B:
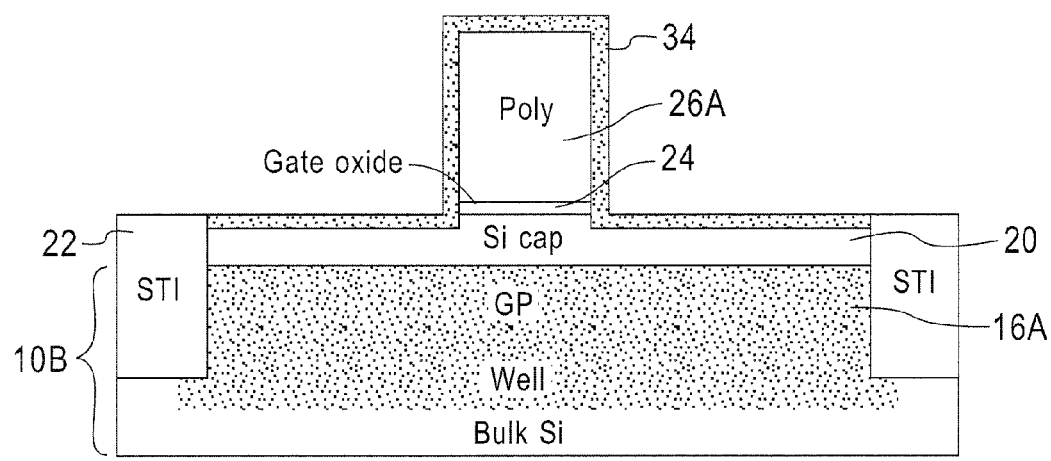
Figure 9C:
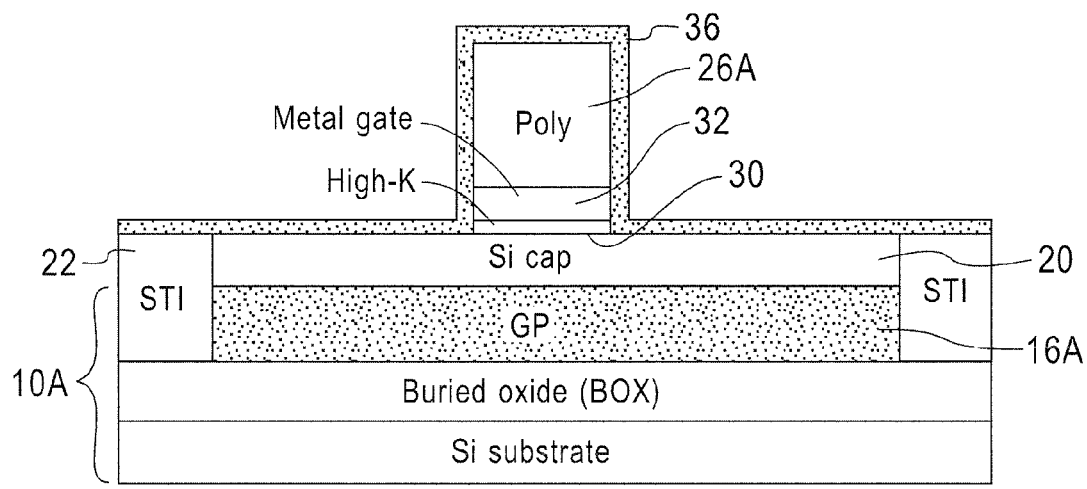
Figure 9D:
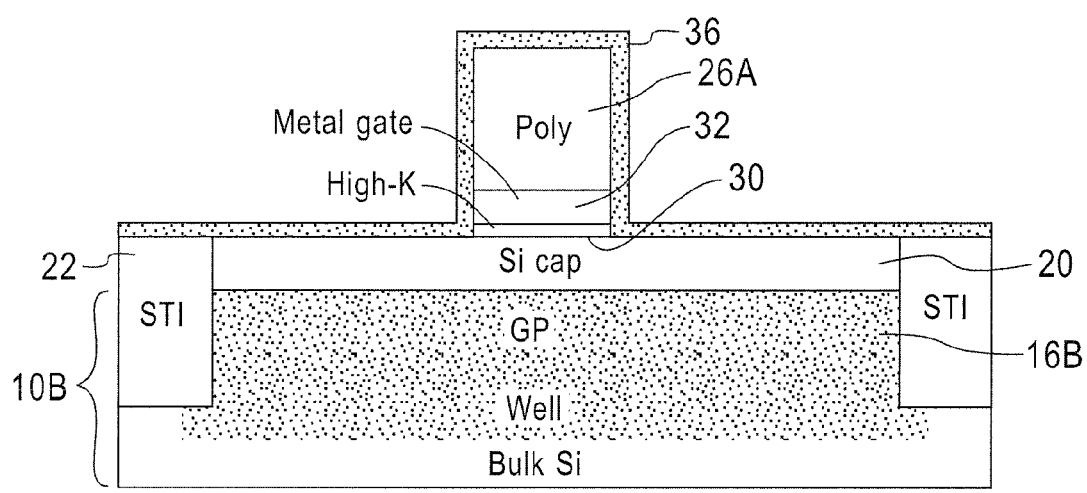
Figure 10A:
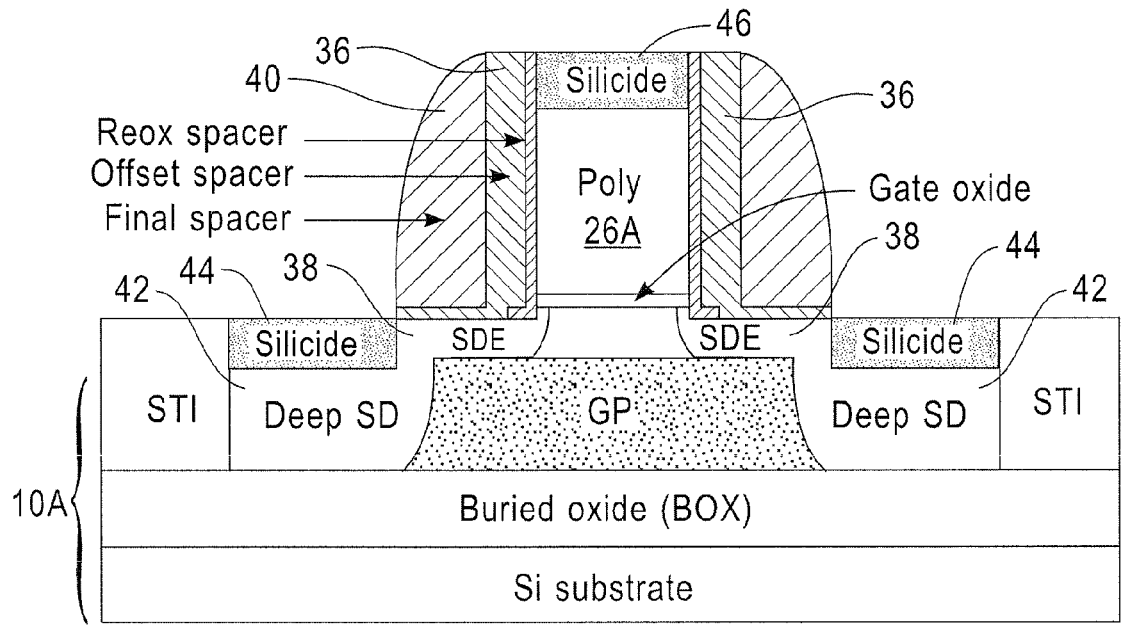
Figure 10B:
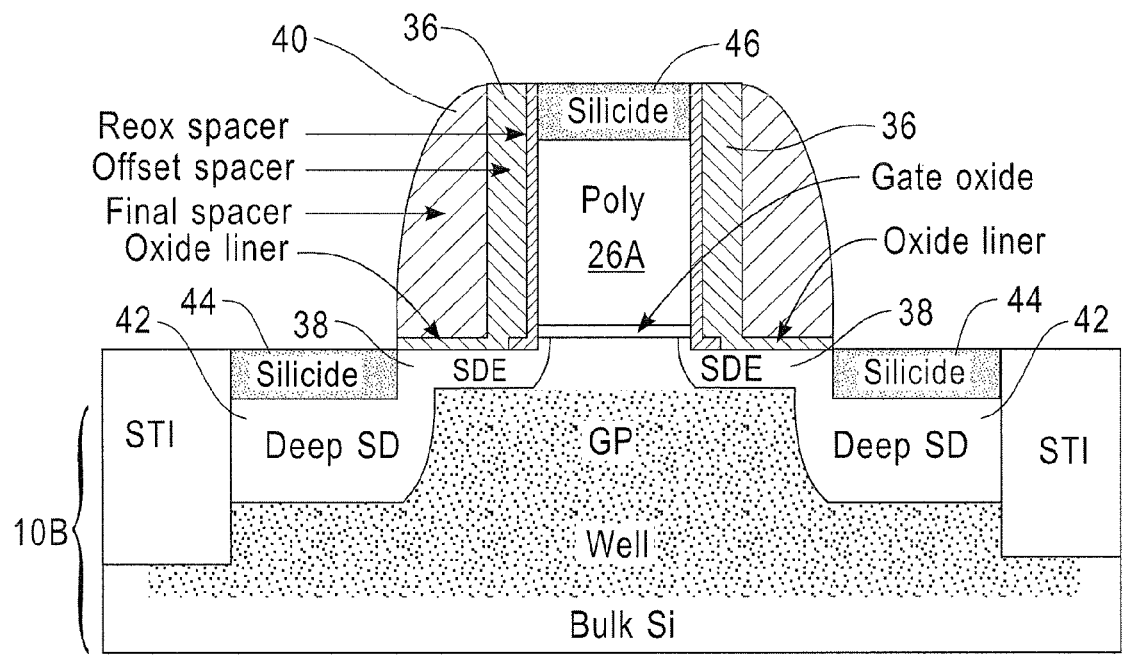
Figure 10C:
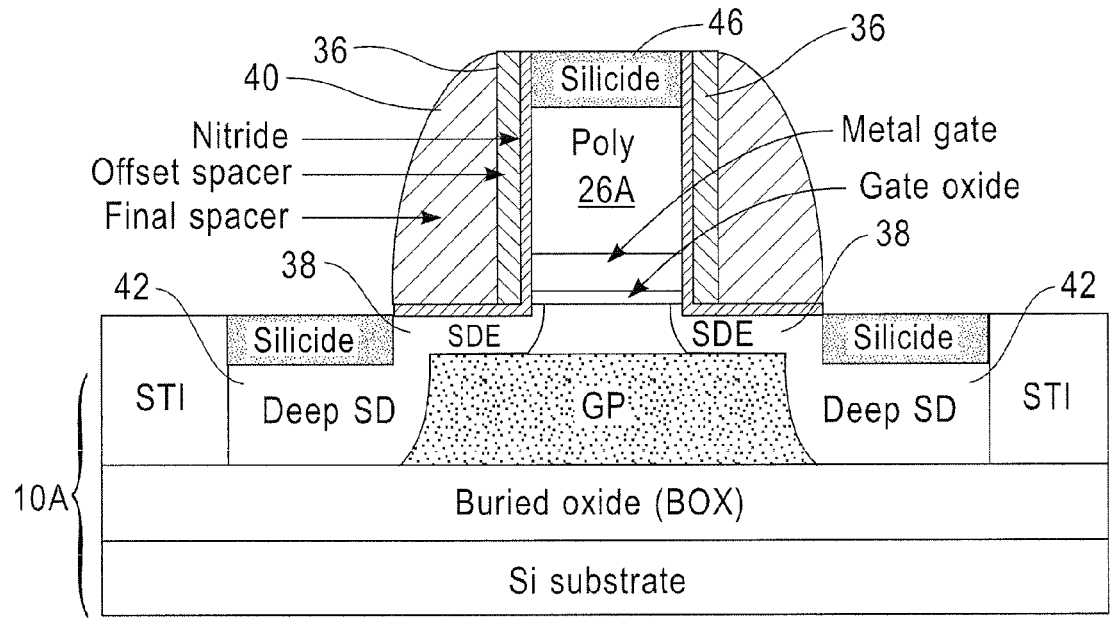
Figure 10D:
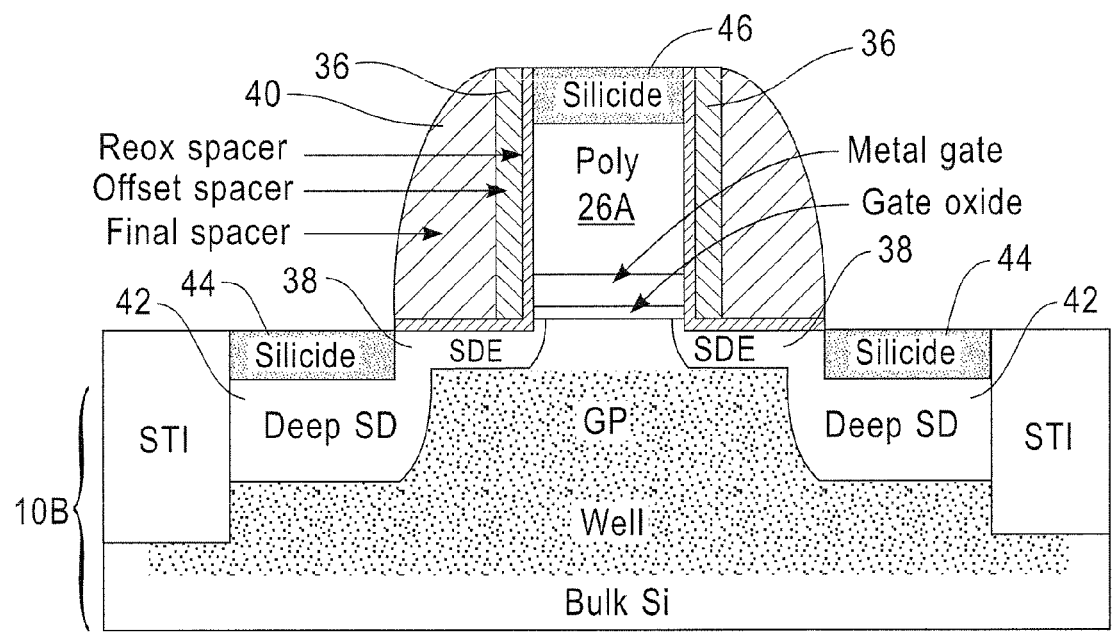
Figure 11A:
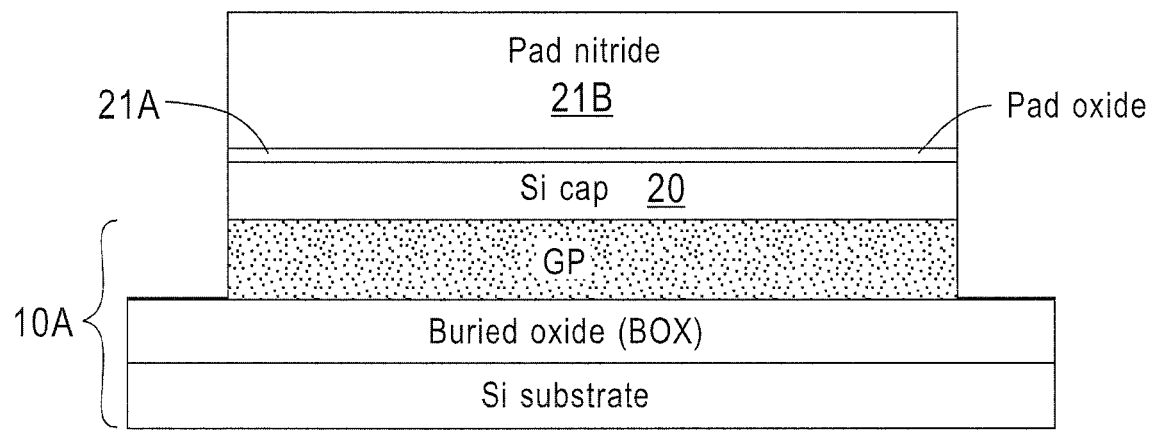
Figure 11B:
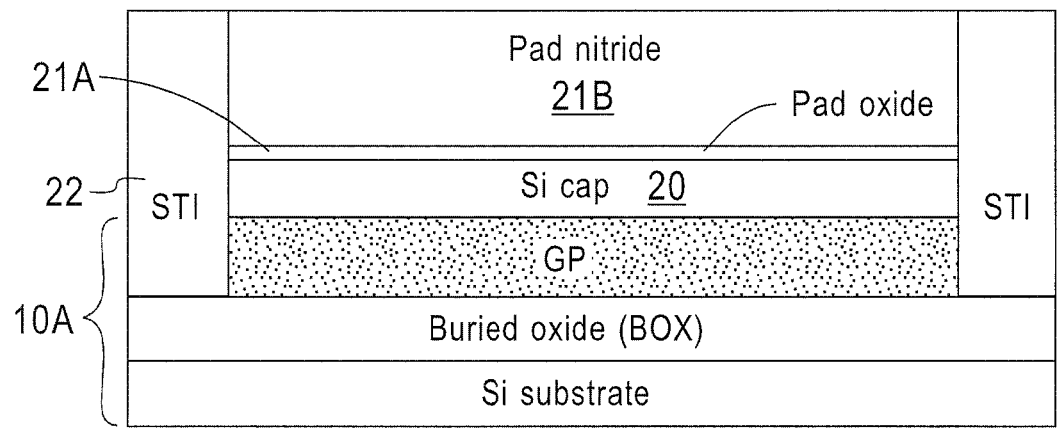

For a wafer with the poly/oxynitride gate stack 24, 26A a gate reoxidation (e.g., 2-5 nm thickness) is performed next to cap the gate stack. The resultant reox cap layer 34 is shown in FIGS. 9A and 9B. For the wafer with the high-K/metal-gate stack 30, 32, 26A, a thin nitride liner (e.g., 2-5 nm thickness) is deposited to cap the gate stack. The resultant nitride liner 36 is shown in FIGS. 9c and 9d. The nitride liner 36 functions as a diffusion barrier to oxygen and prevents the formation of an undesirable underlayer of $SiO_2$ beneath the high-K oxide layer 30. The presence of such an underlayer of oxide, also referred to as under-oxide, can reduce the gate capacitance and thereby reduce transistor on-current.

A rapid thermal anneal is then performed to diffuse the gate doping in the poly Si gate 26A, while not appreciably diffusing the SSRW implants in the crystalline Si GP. The use of RTA for the annealing process is possible because the dopant diffusion rate in polycrystalline Si is significantly faster than in crystalline Si. For the embodiments of FIGS. 9c and 9d this anneal step also serves as the high-K anneal step that is generally needed for improving carrier mobility for the wafer with the high-K/metal-gate stack 30, 32.

Referring now to FIGS. 10a through 10d, an offset spacer 36 is next formed by deposition of an oxide layer and then performing oxide RIE. CMOS extension implants 38 are then performed. This involves photolithography, ion implantation, and PR strip. Photolithography is used for selectively defining NFET or PFET areas for extension implants. NFET extension implants are an n-type species such as As, P, or Sb, and PFET extension implants are p-type species such as B, $BF_2$, or In. Note that halo implants are not performed.

A final spacer 40 needed for deep source/drain (SD) implants 42 and self-aligned silicide 44, 46 is then formed. This involves oxide liner and spacer nitride deposition followed by nitride RIE. The oxide and nitride layers may be deposited using RTCVD or PECVD tools.

After forming the final spacer 40 the CMOS deep SD implants 42 are performed. This involves photolithography, ion implantation, and resist strip. Photolithography is used for selectively defining NFET or PFET areas for deep SD implants. NFET deep SD ion implantation involves n-type species such as As, P, or Sb, while PFET deep SD ion implantation involves p-type species such as B, $BF_2$, or In. For SOI wafers (FIGS. 10a, 10c), the deep SD implants are designed to create deep SD junctions that are butted against the buried oxide (BOX), thereby eliminating deep SD-to-well junction capacitance. For bulk Si wafers (FIGS. 10b, 10d), the deep SD implants are designed to create a graded junction at the bottom of the deep SD region to minimize a deep SD-to-well junction capacitance penalty. The deep SD-to-well junction capacitance is a parasitic capacitance that lowers the switching speed of CMOS circuits.

The wafers 10A, 10B are then subjected to millisecond laser anneal or flash anneal to activate the extension 38 and deep SD 42 implants, while maintaining the steepness of the SSRW well implant profiles. It can be noted that the use of a conventional RTA at this stage would be particularly detrimental to the steepness of the SSRW implants near the deep SD 42 edge due to damage caused by the deep SD implants. It is well known that such damage leads to enhanced diffusion rates of dopants during RTA.

The front-end part of device fabrication finishes with the silicide 44, 46 formation. This involves a HF wet etch to remove oxide, metal deposition, silicide formation anneal, and selective wet etch to remove unreacted metal that leaves the silicide untouched. Suitable metals may include, but are not limited to, Ni, Co, and Pt.

FIGS. 10a-10d show cross-sections of the SOI wafer 10A with the poly/oxynitride gate stack, the bulk Si wafer 10B with the poly/oxynitride gate stack, the SOI wafer 10A with the high-K/metal-gate stack, and the bulk Si wafer 10B with the high-K/metal-gate stack, respectively, after this step.

The remainder of the fabrication, starting with stress nitride deposition, can be accomplished in accordance with conventional transistor processing, and is not detailed here.

It should be appreciated that by the use of the exemplary embodiments of this invention SSRW FET structures are fabricated on SOI or bulk Si substrates with, for example, a poly-Si/oxynitride or a high-K/metal gate stack, where the resultant FET structures exhibit super-steep retrograde wells.

Various modifications and adaptations may become apparent to those skilled in the relevant arts in view of the foregoing description, when read in conjunction with the accompanying drawings and the appended claims. As but some examples, the use of other similar or equivalent materials and/or processing equipment may be attempted by those skilled in the art. However, all such and similar modifications of the teachings of this invention will still fall within the scope of this invention.

Further, the various disclosed layer thicknesses and ranges of thicknesses, processing temperatures, cleaning and etching compositions and the like are intended to be read in an exemplary sense, and not as imposing limitations on the practice of the exemplary embodiments of this invention.

Furthermore, some of the features of the examples of this invention may be used to advantage without the corresponding use of other features. As such, the foregoing description should be considered as merely illustrative of the principles, teachings, examples and exemplary embodiments of this invention, and not in limitation thereof.

What is claimed is:

1. A method to fabricate a semiconductor device, comprising:
    providing a substrate comprised of crystalline silicon;
    implanting a ground plane in the crystalline silicon so as to be adjacent to a surface of the substrate, the ground plane being implanted to exhibit a desired super-steep retrograde well implant doping profile;
    annealing implant damage using a substantially diffusion-less thermal annealing to maintain the desired super-steep retrograde well implant doping profile in the crystalline silicon; and
    performing a silicon epitaxy to deposit a silicon cap layer of undoped silicon over the surface of the substrate in order to provide an undoped channel region for the semiconductor device; and thereafter forming a shallow trench isolation structure, where formation of the shallow trench isolation structure after deposition of the silicon cap layer of undoped silicon enables the silicon cap layer to remain free of faceting.

2. The method of claim 1, where the silicon epitaxy is performed at a temperature at or below about 700° C. to maintain the desired super-steep retrograde well implant doping profile.

3. The method of claim 1, where forming the shallow trench isolation structure comprises defining an active device area on top of the silicon cap layer with padfilms deposition processes controlled to maintain the desired super-steep retrograde well implant doping profile, photolithographically defining the active device area on the padfilm, retaining a portion of the padfilm over the active area, depositing shallow trench isolation oxide and selectively removing the shallow trench isolation oxide by a process that stops on the padfilm to form the shallow trench isolation structure that surrounds the active device area and extends through the silicon cap layer and into the substrate.

4. The method of claim 3, further comprising removing the padfilm within the active area to expose the underlying silicon cap layer, forming a gate oxide structure upon the exposed silicon cap layer, and depositing a layer of polycrystalline silicon over the gate oxide structure.

5. The method of claim 4, further comprising doping the polycrystalline silicon layer with a dopant species appropriate for whether the device within the active area is to be an N-type or a P-type field effect transistor, photolithographically defining an upstanding gate stack structure that includes the gate oxide structure and an overlying portion of the doped polycrystalline silicon layer, forming a reoxidation gate stack structure cap and performing a rapid thermal anneal to diffuse the doping in the overlying portion of the polycrystalline silicon layer while not appreciably affecting the desired super-steep retrograde well implant doping profile in the underlying crystalline silicon.

6. The method of claim 5, further comprising forming an offset spacer over the reoxidation gate stack structure cap, implanting extensions, forming a final spacer over the offset spacer, implanting deep source and drain regions, annealing to activate the implanted extensions and source drain regions with a thermal process selected to not appreciably affect the desired super-steep retrograde well implant doping profile in the underlying crystalline silicon, and forming silicide regions over the implanted source and drain regions and over the gate stack structure.

7. The method of claim 6, where the substrate is a silicon-on-insulator substrate, where the ground plane is formed in a crystalline silicon layer that overlies a buried oxide layer, and where the deep source and drain implants create deep source drain junctions that are butted against the layer of buried oxide.

8. The method of claim 6, where substrate is a bulk crystalline silicon substrate, where implanting a ground plane further comprises implanting a higher energy well to provide well isolation, and where the deep source and drain implants create a graded junction at a bottom of the deep source and drain implant region.

9. The method of claim 3, further comprising removing the padfilm within the active area to expose the silicon cap layer, forming a high dielectric constant oxide/metal gate structure upon the exposed silicon cap layer, and depositing a layer of polycrystalline silicon over the high dielectric constant oxide/metal gate structure.

10. The method of claim 9, further comprising doping the polycrystalline silicon layer with a dopant species appropriate for whether the device within the active area is to be an N-type or a P-type field effect transistor, photolithographically defining an upstanding gate stack structure that includes the high dielectric constant oxide/metal gate structure and an overlying portion of the doped polycrystalline silicon layer, forming a nitride gate stack structure cap and performing a rapid thermal anneal to diffuse the doping in the overlying portion of the polycrystalline silicon layer while not appreciably affecting the desired super-steep retrograde well implant doping profile in the underlying crystalline silicon.

11. The method of claim 10, further comprising forming an offset spacer over the nitride gate stack structure cap, implanting extensions, forming a final spacer over the offset spacer, implanting deep source and drain regions, annealing to activate the implanted extensions and source drain regions with a thermal process selected to not appreciably affect the desired super-steep retrograde well implant doping profile in the underlying crystalline silicon, and forming silicide regions over the implanted source and drain regions and over the gate stack structure.

12. The method of claim 11, where the substrate is a bulk crystalline silicon substrate, where implanting a ground plane further comprises implanting a higher energy well to provide well isolation, and where the deep source and drain implants create a graded junction at a bottom of the deep source and drain implant region.

13. The method of claim 1, where the substrate is a silicon on insulator substrate and where the ground plane is implanted in a crystalline silicon layer that overlies a buried oxide layer.

14. The method of claim 1, where the substrate is a bulk crystalline silicon substrate, and where implanting a ground plane further comprises implanting a higher energy well to provide well isolation.

15. The method of claim 4, where the gate oxide structure is comprised of one of silicon dioxide or silicon oxynitride.

16. The method of claim 9, where the high dielectric constant oxide/metal gate structure is comprised of layers of at least one of $HfO_2$, $ZrO_2$, $Ti_2O_5$ and TiN, TaN.

17. The method of claim 11, where the substrate is a silicon-on-insulator substrate, where the ground plane is implanted in a crystalline silicon layer that overlies a buried oxide layer, and where the deep source and drain implants create deep source drain junctions that are butted against the buried oxide layer.

18. The method of claim 1, where formation of the shallow trench isolation structure after deposition of the silicon cap layer of undoped silicon enables the silicon cap layer to remain substantially uniform in thickness.

* * * * *